(12) United States Patent
Qin et al.

(10) Patent No.: US 10,465,029 B2
(45) Date of Patent: Nov. 5, 2019

(54) PHOTOSENSITIVE RESIN AND MANUFACTURING METHOD THEREOF

(71) Applicant: Pacific Light & Hologram, Inc., South Pasadena, CA (US)

(72) Inventors: Tina Qin, Van Nuys, CA (US); Joshua D. Wiensch, Pasadena, CA (US)

(73) Assignee: Pacific Light & Hologram, Inc., South Pasadena, CA (US)

(*) Notice: Subject to any disclaimer, the term of this patent is extended or adjusted under 35 U.S.C. 154(b) by 86 days.

(21) Appl. No.: 15/887,527

(22) Filed: Feb. 2, 2018

(65) Prior Publication Data
US 2019/0241692 A1 Aug. 8, 2019

(51) Int. Cl.
*C08F 222/20* (2006.01)
*G03H 1/20* (2006.01)
*G03H 1/04* (2006.01)

(52) U.S. Cl.
CPC ............ *C08F 222/20* (2013.01); *G03H 1/20* (2013.01); *C08F 2800/20* (2013.01); *G03H 2001/0428* (2013.01); *G03H 2222/12* (2013.01); *G03H 2260/12* (2013.01)

(58) Field of Classification Search
CPC ...... C08F 222/20; C08F 2800/20; G03H 1/20; G03H 2260/12; G03H 2222/12; G03H 1/0428
See application file for complete search history.

(56) References Cited

U.S. PATENT DOCUMENTS

| 5,008,302 A * | 4/1991 | Husler | C07D 207/325 |
| | | | 430/281.1 |
| 5,340,701 A | 8/1994 | Desobry | |
| 9,458,335 B1 * | 10/2016 | Sloan | C09D 11/12 |
| 2004/0135292 A1 | 7/2004 | Coats et al. | |

FOREIGN PATENT DOCUMENTS

| EP | 2436510 | 4/2012 |
| WO | WO 2010/034998 | 4/2010 |
| WO | WO 2014/171678 | 10/2014 |

OTHER PUBLICATIONS

PCT International Search Report and Written Opinion in International Appln. No. PCT/US2018/065403, dated Feb. 20, 2019.

* cited by examiner

*Primary Examiner* — Jessica M Roswell
(74) *Attorney, Agent, or Firm* — Fish & Richardson P.C.

(57) ABSTRACT

Various embodiments disclosed relate to photopolymerizable compositions that are suitable for making three-dimensional structures when exposed to laser light.

33 Claims, No Drawings

PHOTOSENSITIVE RESIN AND MANUFACTURING METHOD THEREOF

BACKGROUND

Most conventional photosensitive resins do not work in chip-based holographic imaging systems. There is a therefore a need for photosensitive resin compositions with the necessary optical properties that allow for precise control of photon flux and photoinitiation rate.

SUMMARY OF THE INVENTION

In various embodiments, a composition including at least one urethane acrylate monomer, at least one pentaerythritol acrylate monomer, at least one polyester acrylate resin, and at least one photoinitiator is provided.

In various embodiments, a composition comprising about 40 wt % of an aliphatic urethane diacrylate monomer, about 40 wt % of an ethoxylated pentaerythritol tetraacrylate monomer, about 20 wt % of a thiol substituted polyester acrylate resin, and at least one metallocene photoinitiator having the structure:

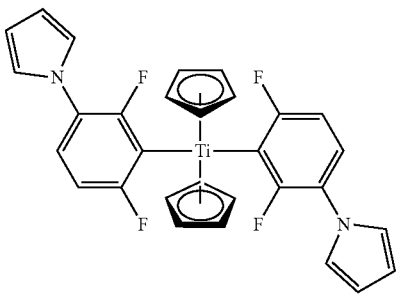

is provided.

In various embodiments, a method of making a polymerizable composition is provided. The method includes combining at least one monomer comprising urethane acrylate, at least one monomer comprising pentaerythritol acrylate, and at least one polyester acrylate resin to form a homogenous mixture, combining the homogenous mixture with a photo initiator to form an initial mixture, and stirring the initial mixture at a temperature greater than about 30° C.

In various embodiments, a method of holographic printing is provided. The method includes projecting a hologram into at least a portion of a composition comprising at least one monomer urethane acrylate, at least one monomer pentaerythritol acrylate, at least one polyester acrylate resin, and at least one photo initiator, and polymerizing the composition substantially in the shape of the hologram.

Advantageously, the compositions herein are capable of polymerizing in the presence of laser light in a short period to form solid objects that are ready for use.

DETAILED DESCRIPTION OF THE INVENTION

Reference will now be made in detail to certain embodiments of the disclosed subject matter. While the disclosed subject matter will be described in conjunction with the enumerated claims, it will be understood that the exemplified subject matter is not intended to limit the claims to the disclosed subject matter.

In various embodiments, a composition containing at least one urethane acrylate, at least one monomer including pentaerythritol acrylate, at least one polyester acrylate resin, and at least one photo initiator is provided in various embodiments, the urethane acrylate, the pentaerythritol acrylate, and the polyester acrylate resin are not photosensitive and do not polymerize under UVA or UVB light.

The urethane acrylate can be an oligomer or a monomer. In various embodiments, the urethane acrylate is a monomer. The urethane acrylate can be present in an amount of about 30 wt % to about 70 wt %, about 35 wt % to about 70 wt %, about 40 wt % to about 70 wt %, about 45 wt % to about 70 wt %, about 50 wt % to about 70 wt %, about 30 wt % to about 65 wt %, about 30 wt % to about 60 wt %, about 30 wt % to about 55 wt %, or about 30 wt % to about 50 wt %, relative to the total weight of the composition. The urethane acrylate can be present in an amount of about 30 wt %, 35 wt %, 40 wt %, 45 wt %, 50 wt %, 55 wt %, 60 wt %, 65 wt %, or 70 wt %. The urethane acrylate can be monofunctional, difunctional, or trifunctional, and can be aliphatic or aromatic. Monofunctional urethane acrylates possess a urethane backbone and one acrylate functionality. Di and tri functional acrylates possess two and three acrylate functional groups respectively attached to at least one urethane component as the backbone. In various embodiments, the urethane acrylate is an aliphatic urethane diacrylate. The aliphatic urethane di acrylate can also be a polyether, polyester, or polyether/polyester based urethane diacrylate. Suitable oligomeric urethane acrylates include, but are not limited to, urethane acrylates with product codes CN9001 NS, CN9006 NS, CN9007, CN9010 NS, CN9013 NS, CN9014 NS, CN9021 NS, CN910A70, CN9110 NS, CN9167, CN9178 NS, CN959, CN963B80, CN964, CN965 NS, CN966H90 NS, CN966J75 NS, CN969 NS, CN970A60 NS, CN971A80, CN975 NS, CN978 NS, CN980 NS, CN981 NS, CN981B88 NS, CN983 NS, CN985B88, CN989 NS, CN9893 NS, CN991 NS, and CN996 NS available from Sartomer Arkema group.

In various embodiments, the pentaerythritol acrylate can be a pentaerythritol monoacrylate, pentaerythritol diacrylate, pentaerythritol triacrylate, or pentaerythritol tetraacrylate. In various embodiments, the pentaerythritol acrylate is pentaerythritol tetraacrylate. The pentaerythritol acrylate can also be ethoxylated, and any one of the pentaerythritol mono-, di-, tri-, or tertaacrylates can be ethoxylated. For example, ethoxylated pentaerythritol tetraacrylate can have the following structure:

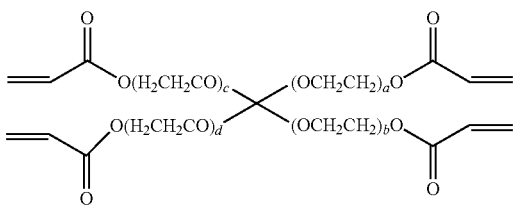

Variables a, b, c, and d can each independently range from 0 to 20.

In various embodiments the pentaerythritol acrylate is present in an amount of about 20 wt % to about 60 wt %, about 30 wt % to about 50 wt %, or about 35 wt % to about 45 wt %. The pentaerythritol acrylate can be present in about 20 wt %, 25 wt %, 30 wt %, 35 wt %, 40 wt %, 45 wt %, or 50 wt %, or any range or sub-range between these values.

The polyester acrylate resin can be include one or more thiol groups. Suitable polyester acrylate resins include, but are not limited to, Ebecryl® LED 02 and Thiocure TMPMP (trimethylolpropane tri(3-mercaptopropionate)), in which the mercapto functionality takes the form of R—S—H where R is a mono, di, or tri functional polymerizable acrylate.

In various embodiments, the thiol groups in the polyester acrylate can derive from, for example, covalent attachment of L-cysteine to the polyester acrylate. In various embodiments, the thiol groups in the polyester acrylate can scavenge reactive oxygen species that would otherwise terminate the radical polymerization. The thiol-containing polyester acrylate can, in various embodiments, impart improved surface cure to the printed object.

The polyester acrylate resin containing one or more thiol groups can be present in an amount of about 5 wt % to about 40 wt %, about 10 wt % to about 30 wt %, or about 15 wt % to about 25 wt %, or any range or sub-range between these values. In various embodiments, the polyester acrylate resin containing one or more thiol groups can be present in an amount of about 5 wt %, 10 wt %, 15 wt %, 20 wt %, 25 wt %, 30 wt %, 35 wt %, or 40 wt %, or any range or sub-range between these values.

In various embodiments, the photo initiator has the formula I

(Formula I)

where M is a transition metal, $L^1$, $L^2$, $L^3$, and $L^4$ are each independently alkyl, aryl, alkylaryl, or heteroaryl, each of which is substituted or unsubstituted. Suitable transition metals can include Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, Au, and Hg. In various embodiments $L^1$ and $L^2$ are identical ligands coordinated to metal M. In various embodiments, $L^3$ and $L^4$ are identical ligands coordinated to metal M.

In various embodiments, M is titanium (Ti). In various embodiments, $L^1$ is substituted or unsubstituted cyclopentadienyl. When, ligand $L^1$ is a substituted cyclopentadienyl, it can have one, two, three, four, or five substitutions on the cyclopentadienyl ring. Each substitution can be independently alkyl, aryl, aralkyl, halogen, or heteroaryl as defined herein. In various embodiments, $L^1$ is cyclopentadienyl ($C_5H_5$).

In various embodiments, $L^3$ is substituted aryl. The aryl can be a phenyl moiety. Ligand $L^3$ can have one, two, three, four, or five substitutions on the aryl ring. Each substitution can be independently alkyl, aryl, aralkyl, halogen, or heteroaryl as defined herein. In various embodiments, $L^3$ has the structure

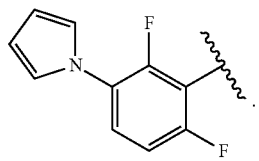 [SMILES: *c1c(F)ccc(-n2cccc2)c1F]

In various embodiments, the photo initiator has the structure

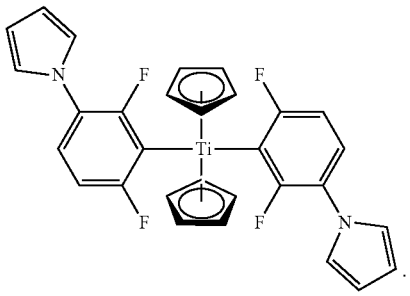

In various embodiments, the photo initiator is present in an amount of from about 0.01 wt % to about 5 wt %, about 0.01 wt % to about 4 wt %, about 0.01 wt % to about 3 wt %, about 0.01 wt % about 2 wt %, about 0.01 wt % to about 1 wt %, about 0.05 wt % to about 0.9 wt %, about 0.1 wt % to about 0.8 wt %, about 0.2 wt % to about 0.7 wt %, about 0.3 wt % to about 0.6 wt %, or any range or sub-range between these values. In various embodiments, the photo initiator is present in an amount of about 0.01 wt %, 0.025 wt %, 0.05 wt %, 0.075 wt %, 0.1 wt %, 0.15 wt %, 0.2 wt %, 0.25 wt %, 0.3 wt %, 0.35 wt %, 0.4 wt %, 0.45 wt %, or 0.5 wt %.

In various embodiments, the composition includes about 40 wt % of an aliphatic urethane diacrylate monomer, about 40 wt % of an ethoxylated pentaerythritol tetraacrylate monomer, about 20 wt % of a thiol substituted polyester acrylate resin; and at least one photo initiator having the structure

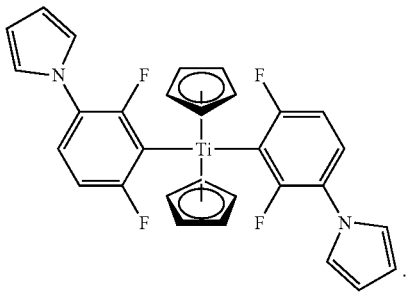

In various embodiments, a method of making a polymerizable composition includes combining at least one urethane acrylate monomer, at least one pentaerythritol acrylate monomer, and at least one polyester acrylate resin to form a homogenous mixture, combining the homogenous mixture with a photo initiator to form an initial mixture, and stirring the initial mixture at a temperature greater than about 30° C.

In various embodiments, the initial mixture is stirred at a temperature of about 35° C. to about 50° C., about 37° C. to about 47° C., about 38° C. to about 46° C., about 39° C. to about 45° C., or any range or sub-range in between these values. In various embodiments, the initial mixture is stirred at a temperature of about 31° C., 32° C., 33° C., 34° C., 35° C., 36° C., 37° C., 38° C., 39° C., 40° C., 41° C., 42° C., 43° C., 44° C., 45° C., 46° C., 47° C., 48° C., 49° C., 50° C., or any range or sub-range between these values.

In various embodiments, the initial mixture is stirred for a period of about 20 minutes to about 3 hours, about 30 minutes to about 2.5 hours, about 40 minutes to about 2 hours, about 45 minutes to about 1.5 hours, about 50 minutes to about 1.25 hours, or any range or sub-range between these values. In various embodiments, the initial mixture is stirred for about 20 minutes, 25 minutes, 30 minutes, 35 minutes, 40 minutes, 45 minutes, 50 minutes, 55 minutes, 60 minutes, or any range or sub-range between these values.

In various embodiments, a method of polymerizing a composition includes exposing a composition that includes at least one urethane acrylate monomer, at least one pentaerythritol acrylate monomer, at least one polyester acrylate resin, and at least one photo initiator to laser light. The laser light can be light generated from any suitable laser source that emits one or more wavelengths within one or more absorption bands of the photoinitiator. Suitable laser sources can include solid-state lasers, fiber lasers, semiconductor lasers, dye lasers, and free electron lasers. In various embodiments, the laser light has a wavelength ranging from about 400 nm to about 540 nm, about 420 nm to about 540 nm, about 440 nm to about 540 nm, about 460 nm to about 540 nm, or about 480 nm to about 540 nm. In various embodiments, the laser light has a wavelength of about 485 nm to about 520 nm, about 490 nm to about 510 nm, about 495 nm to about 505 nm, or any range or sub-range between these values. In various embodiments, the laser light has a wavelength of about 400 nm, 410 nm, 420 nm, 430 nm, 440 nm, 450 nm, 460 nm, 470 nm, 485 nm, 487 nm, 489 nm, 491 nm, 493 nm, 495 nm, 497 nm, 499 nm, 501 nm, 503 nm, 505 nm, 507 nm, 509 nm, 511 nm, 513 nm, 515 nm, 517 nm, 519 nm, 521 nm, 523 nm, 525 nm, 527 nm, 529 nm, 535 nm, or 540 nm.

In various embodiments, the laser light has an intensity ranging from about 1 $mW/cm^2$ to about 200 $mW/cm^2$, about 5 $mW/cm^2$ to about 190 $mW/cm^2$, about 10 $mW/cm^2$ to about 180 $mW/cm^2$, about 20 $mW/cm^2$ to about 170 $mW/cm^2$, about 30 $mW/cm^2$ to about 160 $mW/cm^2$, about 40 $mW/cm^2$ to about 150 $mW/cm^2$, about 50 $mW/cm^2$ to about 140 $mW/cm^2$, about 60 $mW/cm^2$ to about 130 $mW/cm^2$, about 70 $mW/cm^2$ to about 120 $mW/cm^2$, about 80 $mW/cm^2$ to about 110 $mW/cm^2$, or any range or sub-range between these values. In various embodiments, the laser light has an intensity of about 1 $mW/cm^2$, 5 $mW/cm^2$, 110 $mW/cm^2$, 15 $mW/cm^2$, 20 $mW/cm^2$, 25 $mW/cm^2$, 30 $mW/cm^2$, 35 $mW/cm^2$, 40 $mW/cm^2$, 45 $mW/cm^2$, 50 $mw/cm^2$, 55 $mW/cm^2$, 60 $mW/cm^2$, 65 $mW/cm^2$, 70 $mW/cm^2$, 75 $mW/cm^2$, 80 $mW/cm^2$, 85 $mW/cm^2$, 90 $mW/cm^2$, 95 $mW/cm^2$, 100 $mW/cm^2$, or any range or sub-range in between these values.

In various embodiments, the polymerizable composition is subjected to the light for a period of about 10 seconds to about 120 seconds, about 15 seconds to about 110 seconds, about 20 seconds to about 100 seconds, about 25 seconds to about 90 seconds, about 30 seconds to about 80 seconds, about 35 seconds to about 70 seconds, about 40 seconds to about 60 seconds, or any range or sub range in between these values. In various embodiments, the polymerizable composition is subjected to the light for a period of about 10 seconds, 15 seconds, 20 seconds, 25 seconds, 30 seconds, 35 seconds, 40 seconds, 45 seconds, 50 seconds, 55 seconds, 60 seconds, or any range or sub-range in between these values.

In various embodiments, the laser light has a wavelength ranging from about 400 nm to about 540 nm. In various embodiments, the laser light has a wavelength of about 510 nm.

In various embodiments, a method of holographic printing, is provided. The method includes projecting a hologram or three dimensional volumetric wavefront into at least a portion of any one of the compositions described herein and polymerizing the composition substantially in the shape of the hologram. In various embodiments, the hologram includes laser light with a wavelength ranging from about 400 nm to about 530 nm.

EXAMPLES

Various embodiments of the present invention can be better understood by reference to the following Examples which are offered by way of illustration. The present invention is not limited to the Examples given herein.

Synthesis of Photosensitive Resin Composition

Aliphatic urethane acrylate (79.92 grams, 39.96 wt %), ethoxylated pentaerythritol tetraacylate (79.92 grams, 39.96 wt %), thiol modified resin (39.96 grams, 19.98 wt %) were added to a pyrex glass container and mixed until a homogenous mixture was formed. Bis (2,6-difluoro-3-(1-hydropyrro-1-yl)-phenyl)titanocene (200 mg, 0.1 wt %) was added to the homogenous mixture in the absence of light, and the final mixture was stirred at 40° C., for 1 hour, then cooled to room temperature. After cooling, the mixture is ready to use for holographic printing or can be stored in the absence of light at room temperature for later use.

Holographic Printing

The liquid mixture described above is placed into a container, and a mesh support structure is also placed in the container. The liquid mixture is exposed to a hologram projected using green laser light, which forms a three-dimensional holographic image in the liquid mixture. The holograms can be created using a silicon wafer having on it a tiny grid of tunable crystals that can be used to control the magnitude and time delay, or phase, of reflected light shined at the surface of the chip from a laser. Software can adjust the crystals to create patterns of interference in the light, resulting in a three-dimensional light field. After the liquid mixture is exposed to the holographic image for about 5-10 seconds, a three-dimensional object is formed in the liquid mixture on top of the mesh support as a result of the photo induced polymerization of the liquid mixture by the laser light. The mesh support can be removed from the liquid mixture to reveal the fully formed three-dimensional object with substantially the same shape as the hologram.

The terms and expressions that have been employed are used as terms of description and not of limitation, and there is no intention in the use of such terms and expressions of excluding any equivalents of the features shown and described or portions thereof, but it is recognized that various modifications are possible within the scope of the embodiments of the present invention. Thus, it should be understood that although the present invention has been specifically disclosed by specific embodiments and optional features, modification and variation of the concepts herein disclosed may be resorted to by those of ordinary skill in the art, and that such modifications and variations are considered to be within the scope of embodiments of the present invention.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" or "at least one of A or B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts can be carried out in any order without departing from the principles of the invention, except when a temporal or operational sequence is explicitly recited. Furthermore, specified acts can be carried out concurrently unless explicit claim language recites that they be carried out separately. For example, a claimed act of doing X and a claimed act of doing Y can be conducted simultaneously within a single operation, and the resulting process will fall within the literal scope of the claimed process.

The term "about" as used herein can allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%. The term "substantially free of" as used herein can mean having none or having a trivial amount of, such that the amount of material present does not affect the material properties of the composition including the material, such that the composition is about 0 wt % to about 5 wt % of the material, or about 0 wt % to about 1 wt %, or about 5 wt % or less, or less than, equal to, or greater than about 4.5 wt %, 4, 3.5, 3, 2.5, 2, 1.5, 1, 0.9, 0.8, 0.7, 0.6, 0.5, 0.4, 0.3, 0.2, 0.1, 0.01, or about 0.001 wt % or less. The term "substantially free of" can mean having a trivial amount of, such that a composition is about 0 wt % to about 5 wt % of the material, or about 0 wt % to about 1 wt %, or about 5 wt % or less, or less than, equal to, or greater than about 4.5 wt %, 4, 3.5, 3, 2.5, 2, 1.5, 1, 0.9, 0.8, 0.7, 0.6, 0.5, 0.4, 0.3, 0.2, 0.1, 0.01, or about 0.001 wt % or less, or about 0 wt %.

The term "substituted" as used herein in conjunction with a molecule or an organic group as defined herein refers to the state in which one or more hydrogen atoms contained therein are replaced by one or more non-hydrogen atoms. The term "functional group" or "substituent" as used herein refers to a group that can be or is substituted onto a molecule or onto an organic group. Examples of substituents or functional groups include, but are not limited to, a halogen (e.g., F, Cl, Br, and I); an oxygen atom in groups such as hydroxy groups, alkoxy groups, aryl oxy groups, aralkyloxy groups, oxo(carbonyl) groups, carboxyl groups including carboxylic acids, carboxylates, and carboxylate esters; a sulfur atom in groups such as thiol groups, alkyl and aryl sulfide groups, sulfoxide groups, sulfone groups, sulfonyl groups, and sulfonamide groups; a nitrogen atom in groups such as amines, hydroxyamines, nitriles, nitro groups, N-oxides, hydrazides, azides, and enmities; and other heteroatoms in various other groups. Non-limiting examples of substituents that can be bonded to a substituted carbon (or other) atom include F, Cl, Br, I, OR, OC(O)N(R)$_2$, CN, NO, NO$_2$, ONO$_2$, azido, CF$_3$, OCF$_3$, R, O (oxo), S (thiono), C(O), S(O), methylenedioxy, ethylenedioxy, N(R)$_2$, SR, SOR, SO$_2$R, SO$_2$N(R)$_2$, SO$_3$R, C(O)R, C(O)C(O)R, C(O)CH$_2$C(O)R, C(S)R, C(O)OR, OC(O)R, C(O)N(R)$_2$, OC(O)N(R)$_2$, C(S)N(R)$_2$, (CH$_2$)$_{0-2}$N(R)C(O)R, (CH$_2$)$_{0-2}$N(R)N(R)$_2$, N(R)N(R)C(O)R, N(R)N(R)C(O)OR, N(R)N(R)CON(R)$_2$, N(R)SO$_2$R, N(R)SO$_2$N(R)$_2$, N(R)C(O)OR, N(R)C(O)R, N(R)C(S)R, N(R)C(O)N(R)$_2$, N(R)C(S)N(R)$_2$, N(COR)COR, N(OR)R, C(=NH)N(R)$_2$, C(O)N(OR)R, and C(=NOR)R, wherein R can be hydrogen or a carbon-based moiety; for example, R can be hydrogen, (C$_1$-C$_{100}$)hydrocarbyl, alkyl, acyl, cycloalkyl, aryl, aralkyl, heterocyclyl, heteroaryl, or heteroarylalkyl; or wherein two R groups bonded to a nitrogen atom or to adjacent nitrogen atoms can together with the nitrogen atom or atoms form a heterocyclyl.

The term "alkyl" as used herein refers to straight chain and branched alkyl groups and cycloalkyl groups having from 1 to 40 carbon atoms, 1 to about 20 carbon atoms, 1 to 12 carbons or, in various embodiments, from 1 to 8 carbon atoms. Examples of straight chain alkyl groups include those with from 1 to 8 carbon atoms such as methyl, ethyl, n-propyl, n-butyl, n-pentyl, n-hexyl, n-heptyl, and n-octyl groups. Examples of branched alkyl groups include, but are not limited to, isopropyl, iso-butyl, sec-butyl, t-butyl, neopentyl, isopentyl, and 2,2-dimethylpropyl groups. As used herein, the term "alkyl" encompasses n-alkyl, isoalkyl, and anteisoalkyl groups as well as other branched chain forms of alkyl. Representative substituted alkyl groups can be substituted one or more times with any of the groups listed herein, for example, amino, hydroxy, cyano, carboxy, nitro, thio, alkoxy, and halogen groups.

The term "alkenyl" as used herein refers to straight and branched chain and cyclic alkyl groups as defined herein, except that at least one double bond exists between two carbon atoms. Thus, alkenyl groups have from 2 to 40 carbon atoms, or 2 to about 20 carbon atoms, or 2 to 12 carbon atoms or, in various embodiments, from 2 to 8 carbon atoms. Examples include, but are not limited to vinyl, —CH=CH(CH$_3$), —CH=C(CH$_3$)$_2$, —C(CH$_3$)=CH$_2$, —C(CH$_3$)=CH(CH$_3$), —C(CH$_2$CH$_3$)=CH$_2$, cyclohexenyl, cyclopentenyl, cyclohexadienyl, butadienyl, pentadienyl, and hexadienyl among others.

The term "alkynyl" as used herein refers to straight and branched chain alkyl groups, except that at least one triple bond exists between two carbon atoms. Thus, alkynyl groups have from 2 to 40 carbon atoms, 2 to about 2.0 carbon atoms, or from 2 to 12 carbons or, in various embodiments, from 2 to 8 carbon atoms. Examples include, but are not limited to —C≡CH, —C≡C(CH$_3$), —C≡C(CH$_2$CH$_3$), —CH$_2$C≡CH, —CH$_2$C≡C(CH$_3$), and —CH$_2$C≡C(CH$_2$CH$_3$) among others.

The term "acyl" as used herein refers to a group containing a carbonyl moiety wherein the group is bonded via the carbonyl carbon atom. The carbonyl carbon atom is bonded to a hydrogen forming a "formyl" group or is bonded to another carbon atom, which can be part of an alkyl, aryl, aralkyl cycloalkyl, cycloalkylalkyl, heterocyclyl, heterocyclylalkyl, heteroaryl, heteroarylalkyl group or the like. An acyl group can include 0 to about 12, 0 to about 20, or 0 to about 40 additional carbon atoms bonded to the carbonyl group. An acyl group can include double or triple bonds within the meaning herein. An acryloyl group is an example of an acyl group. An acyl group can also include heteroatoms within the meaning herein. A nicotinoyl group (pyridyl-3-carbonyl) is an example of an acyl group within the meaning herein. Other examples include acetyl, benzoyl, phenylacetyl, pyridylacetyl, cinnamoyl, and acryloyl groups and the like. When the group containing the carbon atom that is bonded to the carbonyl carbon atom contains a halogen, the group is termed a "haloacyl" group. An example is a trifluoroacetyl group.

The term "cycloalkyl" as used herein refers to cyclic alkyl groups such as, but not limited to, cyclopropyl, cyclobutyl, cyclopentyl, cyclohexyl, cycloheptyl, and cyclooctyl groups. In various embodiments, the cycloalkyl group can have 3 to about 8-12 ring members, whereas in other embodiments the number of ring carbon atoms range from 3 to 4, 5, 6, or 7. Cycloalkyl groups further include polycyclic cycloalkyl groups such as, but not limited to, norbornyl, adamantyl, bornyl, camphenyl, isocamphenyl, and carenyl groups, and fused rings such as, but not limited to, decalinyl, and the like. Cycloalkyl groups also include rings that are substituted with straight or branched chain alkyl groups as defined herein. Representative substituted cycloalkyl groups can be mono-substituted or substituted more than once, such as, but not limited to, 2,2-, 2,3-, 2,4- 2,5- or 2,6-disubstituted cyclohexyl groups or mono-, di- or tri-substituted norbornyl or cycloheptyl groups, which can be substituted with, for example, amino, hydroxy, cyano, carboxy, nitro, thio, alkoxy, and halogen groups. The term "cycloalkenyl" alone or in combination denotes a cyclic alkenyl group.

The term "aryl" as used herein refers to cyclic aromatic hydrocarbon groups that do not contain heteroatoms in the ring. Thus aryl groups include, but are not limited to, phenyl, azulenyl, heptalenyl, biphenyl, indacenyl, fluorenyl, phenanthrenyl, triphenylenyl, pyrenyl, naphthacenyl, chrysenyl, biphenylenyl, anthracenyl, and naphthyl groups. In various embodiments, aryl groups contain about 6 to about 14 carbons in the ring portions of the groups. Aryl groups can be unsubstituted or substituted, as defined herein. Representative substituted aryl groups can be mono-substituted or substituted more than once, such as, but not limited to, a phenyl group substituted at any one or more of 2-, 3-, 4-, 5-, or 6-positions of the phenyl ring, or a naphthyl group substituted at any one or more of 2- to 8-positions thereof.

The term "aralkyl" as used herein refers to alkyl groups as defined herein in which a hydrogen or carbon bond of an alkyl group is replaced with a bond to an aryl group as defined herein. Representative aralkyl groups include benzyl and phenylethyl groups and fused (cycloalkylaryl)alkyl groups such as 4-ethyl-indanyl. Aralkenyl groups are alkenyl groups as defined herein in which a hydrogen or carbon bond of an alkyl group is replaced with a bond to an aryl group as defined herein.

The term "heterocyclyl" as used herein refers to aromatic and non-aromatic ring compounds containing three or more ring members, of which one or more is a heteroatom such as, but not limited to, N, O and S. Thus, a heterocyclyl can be a cycloheteroalkyl, or a heteroaryl, or if polycyclic, any combination thereof. In various embodiments, heterocyclyl groups include 3 to about 20 ring members, whereas other such groups have 3 to about 15 ring members. A heterocyclyl group designated as a $C_2$-heterocyclyl can be a 5-ring with two carbon atoms and three heteroatoms, a 6-ring with two carbon atoms and four heteroatoms and so forth. Likewise a $C_4$-heterocyclyl can be a 5-ring with one heteroatom, a 6-ring with two heteroatoms, and so forth. The number of carbon atoms plus the number of heteroatoms equals the total number of ring atoms. A heterocyclyl ring can also include one or more double bonds. A heteroaryl ring is an embodiment of a heterocyclyl group. The phrase "heterocyclyl group" includes fused ring species including those that include fused aromatic and non-aromatic groups. For example, a dioxolanyl ring and a benzdioxolanyl ring system (methylenedioxyphenyl ring system) are both heterocyclyl groups within the meaning herein. The phrase also includes polycyclic ring systems containing a heteroatom such as, but not limited to, quinuclidyl. Heterocyclyl groups can be unsubstituted, or can be substituted as discussed herein. Heterocyclyl groups include, but are not limited to, pyrrolidinyl, piperidinyl, piperazinyl, morpholinyl, pyrrolyl, pyrazolyl, triazolyl, tetrazolyl, oxazolyl, isoxazolyl, thiazolyl, pyridinyl, thiophenyl, benzothiophenyl, benzofuranyl, dihydrobenzofuranyl, indolyl, dihydroindolyl, azaindolyl, indazolyl, benzimidazolyl, azabenzimidazolyl, benzoxazolyl, benzothiazolyl, benzothiadiazolyl, imidazopyridinyl, isoxazolopyridinyl, thianaphthalenyl, purinyl, xanthinyl, adeninyl, guaninyl, quinolinyl, isoquinolinyl, tetrahydroquinolinyl, quinoxalinyl, and quinazolinyl groups. Representative substituted heterocyclyl groups can be mono-substituted or substituted more than once, such as, but not limited to, piperidinyl or quinolinyl groups, which are 2-, 3-, 4-, 5-, or 6-substituted, or disubstituted with groups such as those listed herein.

The term "heteroaryl" as used herein refers to aromatic ring compounds containing 5 or more ring members, of which, one or more is a heteroatom such as, but not limited to, N, O and S; for instance, heteroaryl rings can have 5 to about 8-12 ring members. A heteroaryl group is a variety of a heterocyclyl group that possesses an aromatic electronic structure. A heteroaryl group designated as a $C_2$-heteroaryl can be a 5-ring with two carbon atoms and three heteroatoms, a 6-ring with two carbon atoms and four heteroatoms and so forth. Likewise a $C_4$-heteroaryl can be a 5-ring with one heteroatom, a 6-ring with two heteroatoms, and so forth. The number of carbon atoms plus the number of heteroatoms sums up to equal the total number of ring atoms. Heteroaryl groups include, but are not limited to, groups such as pyrrolyl, pyrazolyl, triazolyl, tetrazolyl, oxazolyl, isoxazolyl, thiazolyl, pyridinyl, thiophenyl, benzothiophenyl, benzofuranyl, indolyl, azaindolyl, indazolyl, benzimidazolyl, azabenzimidazolyl, benzoxazolyl, benzothiazolyl, benzothiadiazolyl imidazopyridinyl, isoxazolopyridinyl, thianaphthalenyl, purinyl, xanthinyl, adeninyl, guaninyl, quinolinyl, isoquinolinyl, tetrahydroquinolinyl, quinoxalinyl and quinazolinyl groups. Heteroaryl groups can be unsubstituted, or can be substituted with groups as is discussed herein. Representative substituted heteroaryl groups can be substituted one or more times with groups such as those listed herein.

Additional examples of aryl and heteroaryl groups include but are not limited to phenyl, biphenyl, indenyl, naphthyl (1-naphthyl, 2-naphthyl), N-hydroxytetrazolyl, N-hydroxytriazolyl, N-hydroxyimidazolyl, anthracenyl (1-anthracenyl, 2-anthracenyl, 3-anthracenyl), thiophenyl (2-thienyl, 3-thienyl), furyl (2-furyl, 3-furyl), indolyl, oxadiazolyl, isoxazolyl, quinazolinyl, fluorenyl, xanthenyl, isoindanyl, benzhydryl, acridinyl, thiazolyl, pyrrolyl (2-pyrrolyl), pyrazolyl (3-pyrazolyl), imidazolyl 2-imidazolyl, 4-imidazolyl, 5-imidazolyl), triazolyl (1,2,3-triazol-1-yl, 1,2,3-triazol-2-yl 1,2, 3-triazol-4-yl, 1,2,4-triazol-3-yl) oxazolyl (2-oxazolyl, 4-oxazolyl, 5-oxazolyl), thiazolyl (2-thiazolyl, 4-thiazolyl, 5-thiazolyl), pyridyl (2-pyridyl, 3-pyridyl, 4-pyridyl), pyrimidinyl (2-pyrimidinyl, 4-pyrimidinyl, 6-pyrimidinyl), pyrazinyl, pyridazinyl (3-pyridazinyl, 4-pyridazinyl, 5-pyridazinyl), quinolyl (2-quinolyl, 3-quinolyl, 4-quinolyl, 7-quinolyl 8-quinolyl), isoquinolyl (1-isoquinolyl, 3-isoquinotyl, 4-isoquinotyl, 5-isoquinolyl, 6-isoquinolyl, 7-isoquinolyl, 8-isoquinolyl), benzo[b]furanyl (2-benzo[b]furanyl, 3-benzo[b]furanyl, 4-benzo[b]furanyl, 5-benzo[b]furanyl, 6-benzo[b]furanyl, 7-benzo[b]furanyl), 2,3-dihydro-benzo[b]furanyl (2-(2,3-dihydro-benzo[b]furanyl), 3-(2,3-dihydro-benzo[b]furanyl), dihydro-benzo[b]furanyl), 5-(2,3-dihydro-benzo[b]furanyl), 6-(2,3-dihydro-benzo[b]furanyl), 7-(2,3-dihydro-benzo[b]furanyl), benzo[b]thiophenyl (2-benzo[b]thiophenyl, 3-benzo[b]thiophenyl, 4-benzo[b]thiophenyl, 5-benzo[b]thiophenyl, 6-benzo[b]thiophenyl, 7-benzo[b]thiophenyl), 2,3-dihydro-benzo[b]thiophenyl, (2-(2,3-dihydro-benzo[b]thiophenyl), 3-(2,3-dihydro-benzo[b]thiophenyl), 4-(2,3-dihydro-benzo[b]thiophenyl), 5-(2,3-dihydro-benzo[b]thiophenyl), 6-(2,3-dihydro-benzo[b]thiophenyl), 7-(2,3-dihydro-benzo[b]thiophenyl), indolyl (1-indolyl, 2-indolyl, 3-indolyl, 4-indolyl, 7-indolyl), indazole (1-indazolyl, 3-indazolyl, 4-indazolyl, 5-indazolyl, 6-indazolyl, 7-indazolyl), benzimidazolyl (1-benzimidazolyl, 2-benzimidazolyl, 4-benzimidazolyl, 5-benzimidazolyl, 6-benzimidazolyl, 7-benzimidazolyl, 8-benzimidazolyl), benzoxazolyl (1-benzoxazolyl, 2-benzoxazolyl), benzothiazolyl (1-benzothiazolyl, 2-benzothiazolyl, 4-benzothiazolyl, 5-benzothiazolyl, 6-benzothiazolyl, 7-benzothiazolyl), carbazolyl (1-carbazolyl, 2-carbazolyl, 3-carbazolyl, 4-carbazolyl, 5H-dibenz[b,f]azepine (5H-dibenz[b,f]azepin-1-yl, 5H-dibenz[b,f]azepine-2-yl, 5H-dibenz[b,f]azepine-3-yl, 5H-dibenz[b,f]azepine-4-yl, 5H-dibenz[b,f]azepine-5-yl), 10,11-dihydro-5H-dibenz[b,f]azepine (10,11-dihydro-5H-dibenz[b,f]azepine-1-yl, 10,11-dihydro-5H-dibenz[b,f]azepine-2-yl, 10,11-dihydro-5H-dibenz[b,f]azepine-3-yl, 10,11-dihydro-5H-dibenz[b,f]azepine-4-yl, 10,11-dihydro-5H-dibenz[b,f]azepine-5-yl), and the like.

The term "heterocyclylalkyl" as used herein refers to alkyl groups as defined herein in which a hydrogen or carbon bond of an alkyl group as defined herein is replaced with a bond to a heterocyclyl group as defined herein. Representative heterocyclyl alkyl groups include, but are not limited to, furan-2-yl methyl, furan-3-yl methyl, pyridine-3-yl methyl, tetrahydrofuran-2-yl ethyl, and indol-2-yl propyl.

The term "heteroarylalkyl" as used herein refers to alkyl groups as defined herein in which a hydrogen or carbon bond of an alkyl group is replaced with a bond to a heteroaryl group as defined herein.

The term "alkoxy" as used herein refers to an oxygen atom connected to an alkyl group, including a cycloalkyl group, as are defined herein. Examples of linear alkoxy groups include but are not limited to methoxy, ethoxy, propoxy, butoxy, pentyloxy, hexyloxy, and the like. Examples of branched alkoxy include but are not limited to isopropoxy, sec-butoxy, tert-butoxy isopentyloxy, isohexyloxy, and the like. Examples of cyclic alkoxy include but are not limited to cyclopropyloxy, cyclobutyloxy, cyclopentyloxy, cyclohexyloxy, and the like. An alkoxy group can include about 1 to about 12, about 1 to about 20, or about 1 to about 40 carbon atoms bonded to the oxygen atom, and can further include double or triple bonds, and can also include heteroatoms. For example, an allyloxy group or a methoxyethoxy group is also an alkoxy group within the meaning herein, as is a methylenedioxy group in a context where two adjacent atoms of a structure are substituted therewith.

The term "amine" as used herein refers to primary, secondary, and tertiary amities having, e.g., the formula N(group)$_3$ wherein each group can independently be H or non-H, such as alkyl, aryl, and the like. Amines include but are not limited to R—NH$_2$, for example, alkylamines, arylamines, alkylarylamines; R$_2$NH wherein each R is independently selected, such as dialkylamines, diarylamines, aralkylamines, heterocyclylamines and the like; and R$_3$N wherein each R is independently selected, such as trialkylamines, dialkylarylamines, alkyldiarylamines, triarylamines, and the like. The term "amine" also includes ammonium ions as used herein.

The term "amino group" as used herein refers to a substituent of the form —NH$_2$, —NHR, —NR$_2$, —NR$_3^+$, wherein each R is independently selected, and protonated forms of each, except for —NR$_3^+$, which cannot be protonated. Accordingly, any compound substituted with an amino group can be viewed as an amine. An "amino group" within the meaning herein can be a primary, secondary, tertiary, or quaternary amino group. An "alkylamino" group includes a monoalkylamino, dialkylamino, and trialkylamino group.

The terms "halo," "halogen," or "halide" group, as used herein, by themselves or as part of another substituent, mean, unless otherwise stated, a fluorine, chlorine, bromine, or iodine atom.

The term "haloalkyl" group, as used herein, includes mono-halo alkyl groups, poly-halo alkyl groups wherein all halo atoms can be the same or different, and per-halo alkyl groups, wherein all hydrogen atoms are replaced by halogen atoms, such as fluoro. Examples of haloalkyl include trifluoromethyl, 1,1-dichloroethyl, 1,2-dichloroethyl, 1,3-dibromo-3,3-difluoropropyl, perfluorobutyl, and the like.

The term "laser light," as used herein, refers to spatially and temporally coherent light. Laser light sources include chemical-lasers, solid-state lasers, fiber lasers, semiconductor lasers, and dye lasers.

ENUMERATED EMBODIMENTS

The following exemplary embodiments are provided, the numbering of which is not to be construed as designating levels of importance:

Embodiment 1 provides a composition comprising: at least one monomer or oligomer comprising urethane acrylate; at least one monomer comprising pentaerythritol acrylate; at least one polyester acrylate resin; and at least one photo initiator.

Embodiment 2 provides the composition of embodiment 1, wherein the urethane acrylate comprises a urethane diacrylate.

Embodiment 3 provides the composition according to any one of embodiments 1-2, wherein the urethane diacrylate is an aliphatic urethane diacrylate.

Embodiment 4 provides the composition according to any one of embodiments 1-3, wherein the urethane acrylate is present in an amount of about 30 wt % to about 70 wt %.

Embodiment 5 provides the composition according to any one of embodiments 1-4, wherein the pentaerythritol acrylate comprises a pentaerythritol tetraacrylate.

Embodiment 6 provides the composition according to any one of embodiments 1-5, wherein the pentaerythritol tetraacrylate is ethoxylated.

Embodiment 7 provides the composition according to any one of embodiments 1-6, wherein the pentaerythritol acrylate is present in an amount of about 30 wt % to about 70 wt %.

Embodiment 8 provides the composition according to any one of embodiments 1-7, wherein the polyester acrylate resin comprises one or more thiol groups.

Embodiment 9 provides the composition according to any one of embodiments 1-8, wherein the polyester acrylate resin is present in an amount of about 10 wt % to about 30 wt %.

Embodiment 10 provides the composition according to any one of embodiments 1-9, wherein the photo initiator has the formula I

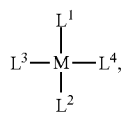

(Formula I)

wherein, M is a transition metal; and $L^1$, $L^2$, $L^3$, and are each independently alkyl, aryl, alkylaryl, or heteroaryl, each of which is substituted or unsubstituted.

Embodiment 11 provides the composition according to any one of embodiments 1-10, wherein $L^1$ and $L^2$ are identical.

Embodiment 12 provides the composition according to any one of embodiments 1-11, wherein $L^3$ and $L^4$ are identical.

Embodiment 13 provides the composition according to any one of embodiments 1-12, wherein M is titanium.

Embodiment 14 provides the composition according to any one of embodiments 1-13, wherein $L^1$ is substituted or unsubstituted cyclopentadienyl.

Embodiment 15 provides the composition according to any one of embodiments 1-14, wherein $L^1$ is cyclopentadienyl.

Embodiment 16 provides the composition according to any one of embodiments 1-15, wherein $L^3$ is substituted aryl.

Embodiment 17 provides the composition according to any one of embodiments 1-16, wherein $L^3$ has the structure

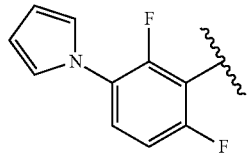

Embodiment 18 provides the composition according to any one of embodiments 1-17, wherein the photo initiator has the structure

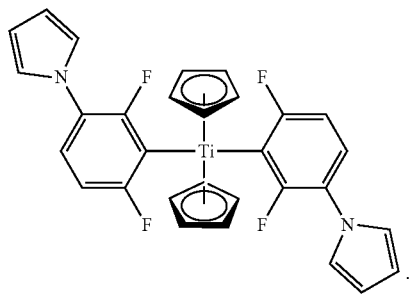

Embodiment 19 provides the composition according to any one of embodiments 1-18, wherein the photo initiator is present in an amount of from about 0.01 wt % to about 1 wt %.

Embodiment 20 provides a composition comprising: about 40 wt % of a monomer comprising aliphatic urethane diacrylate; about 40 wt % of monomer comprising ethoxylated pentaerythritol tetraacrylate; about 20 wt % of a thiol substituted polyester acrylate resin; and at least one photo initiator having the structure

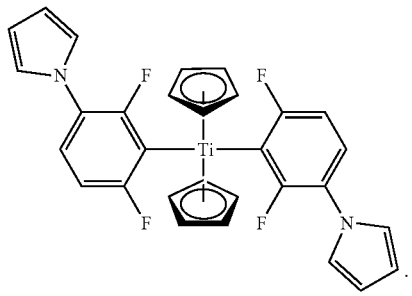

Embodiment 21 provides a method of making a polymerizable composition, comprising: combining at least one monomer comprising urethane acrylate, at least one monomer comprising pentaerythritol acrylate, and at least one polyester acrylate resin to form a homogenous mixture; combining the homogenous mixture with a photo initiator to form an initial mixture; and stirring the initial mixture at a temperature greater than about 30° C.

Embodiment 22 provides the method according to any one of embodiments 20-21, wherein initial mixture is stirred at about 4° C.

Embodiment 23 provides the method according to any one of embodiments 20-22, wherein the initial mixture is stirred for a period of about 20 minutes to about 3 hours.

Embodiment 24 provides a method of polymerizing a composition, comprising: exposing the composition of claim 1-20 to laser light.

Embodiment 25 provides the method according to any one of embodiments 20-24, wherein the light has an intensity ranging from about 1 mW/cm² to about 200 mW/cm².

Embodiment 26 provides the method according to any one of embodiments 20-25, wherein the composition is subjected to the light for a period of about 10 seconds to about 120 seconds.

Embodiment 27 provides the method according to any one of embodiments 20-26, wherein the laser light has a wavelength ranging from about 400 nm to about 530 nm.

Embodiment 28 provides a method of holographic printing, comprising: projecting a hologram into at least a portion of the composition of claim 20-27; and polymerizing the composition substantially in the shape of the hologram.

Embodiment 29 provides the method according to any one of embodiments 20-28, wherein the hologram comprises laser light with a wavelength ranging from about 480 nm to about 530 nm.

What is claimed is:
1. A composition comprising:
   at least one monomer or oligomer comprising urethane acrylate;
   at least one monomer comprising pentaerythritol acrylate;
   at least one polyester acrylate resin;
   at least one photo initiator; and the polyester acrylate resin comprises one or more thiol groups;

wherein the urethane acrylate is present in an amount of 35 wt % to about 70 wt %.

2. The composition of claim 1, wherein the urethane acrylate comprises a urethane diacrylate.

3. The composition of claim 2, wherein the urethane diacrylate is an aliphatic urethane diacrylate.

4. The composition of claim 1, wherein the urethane acrylate is present in an amount of about 40 wt % to about 70 wt %.

5. The composition of claim 1, wherein the pentaerythritol acrylate comprises a pentaerythritol tetraacrylate.

6. The composition of claim 5, wherein the pentaerythritol tetraacrylate is ethoxylated.

7. The composition of claim 1, wherein the pentaerythritol acrylate is present in an amount of about 30 wt % to about 70 wt %.

8. The composition of claim 1, wherein the polyester acrylate resin is present in an amount of about 10 wt % to about 30 wt %.

9. The composition of claim 1, wherein the photo initiator has the formula I

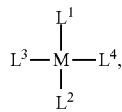

(Formula I)

wherein,

M is a transition metal; and $L^1$, $L^2$, $L^3$, and $L^4$ are each independently alkyl, aryl, alkylaryl, or heteroaryl, each of which is substituted or unsubstituted.

10. The composition of claim 9, wherein $L^1$ is substituted or unsubstituted cyclopentadienyl.

11. The composition of claim 10, wherein $L^1$ is cyclopentadienyl.

12. The composition of claim 9, wherein $L^3$ is substituted aryl.

13. The composition of claim 12, wherein $L^3$ has the structure

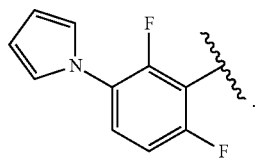 [SMILES: *c1c(F)ccc(-n2cccc2)c1F]

14. The composition of claim 9, wherein the photo initiator has the structure

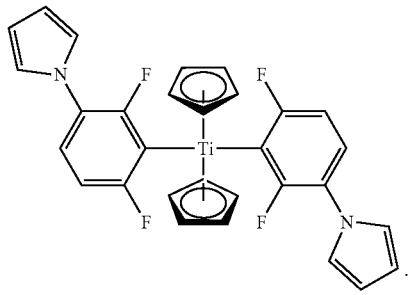

15. The composition of claim 1, wherein the photo initiator is present in an amount of from about 0.01 wt % to about 1 wt %.

16. A composition comprising:

about 40 wt % of a monomer comprising aliphatic urethane diacrylate;

about 40 wt % of monomer comprising ethoxylated pentaerythritol tetraacrylate;

about 20 wt % of a thiol substituted polyester acrylate resin; and at least one photo initiator having the structure

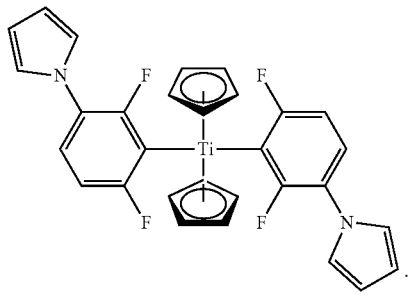

17. A method of making a polymerizable composition, comprising:

combining at least one monomer comprising urethane acrylate, at least one monomer comprising pentaerythritol acrylate, and at least one polyester acrylate resin to form a homogenous mixture;

combining the homogenous mixture with a photo initiator to form an initial mixture; and stirring the initial mixture at a temperature greater than about 30° C., wherein the polyester acrylate resin comprises one or more thiol groups, and the homogeneous mixture comprises 35 wt % to about 70 wt % of the urethane acrylate.

18. The method of claim 17, wherein initial mixture is stirred at about 40° C.

19. A method of polymerizing a composition, comprising:

exposing the composition of claim 1 to laser light.

20. A composition comprising:

at least one monomer or oligomer comprising urethane acrylate;

at least one monomer comprising pentaerythritol acrylate;

at least one polyester acrylate resin; and at least one photo initiator, wherein:
the photo initiator has the formula I

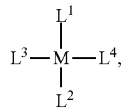
(Formula I)

M is a transition metal;
L$^1$, L$^2$, and L$^4$ are each independently alkyl, aryl, alkylaryl, or heteroaryl, each of which is substituted or unsubstituted;
L$^3$ has the structure

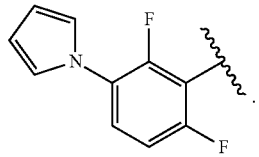 [SMILES: *c1c(F)ccc(-n2cccc2)c1F]

and
the urethane acrylate is present in an amount of 35 wt % to about 70 wt %.

21. The composition of claim 20, wherein the urethane acrylate comprises a urethane diacrylate.

22. The composition of claim 21, wherein the urethane diacrylate is an aliphatic urethane diacrylate.

23. The composition of claim 20, wherein the urethane acrylate is present in an amount of about 40 wt % to about 70 wt %.

24. The composition of claim 20, wherein the pentaerythritol acrylate comprises a pentaerythritol tetraacrylate.

25. The composition of claim 24, wherein the pentaerythritol tetraacrylate is ethoxylated.

26. The composition of claim 20, wherein the pentaerythritol acrylate is present in an amount of about 30 wt % to about 70 wt %.

27. The composition of claim 20, wherein the polyester acrylate resin comprises one or more thiol groups.

28. The composition of claim 20, wherein the polyester acrylate resin is present in an amount of about 10 wt % to about 30 wt %.

29. The composition of claim 20, wherein L$^1$ is substituted or unsubstituted cyclopentadienyl.

30. The composition of claim 20, wherein L$^1$ is cyclopentadienyl.

31. The composition of claim 20, wherein the photo initiator has the structure

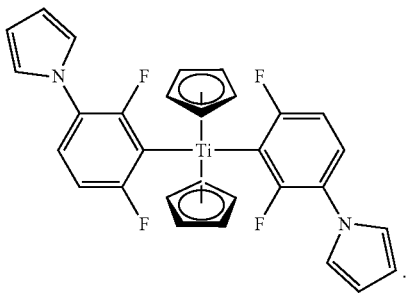

32. The composition of claim 20, wherein the photo initiator is present in an amount of from about 0.01 wt % to about 1 wt %.

33. A method of polymerizing a composition, comprising: exposing the composition of claim 20 to laser light.

* * * * *

UNITED STATES PATENT AND TRADEMARK OFFICE
CERTIFICATE OF CORRECTION

PATENT NO.        : 10,465,029 B2
APPLICATION NO.   : 15/887527
DATED             : November 5, 2019
INVENTOR(S)       : Tina Qin and Joshua D. Wiensch Page 1 of 1

It is certified that error appears in the above-identified patent and that said Letters Patent is hereby corrected as shown below:

In the Claims

Column 15, Line 2, Claim 1, delete "groups;" and insert -- groups, --;

Column 17, Lines 17-24 (approx.), Claim 20, delete " 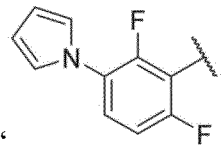 ." and insert 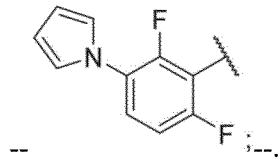 --  ;--.

Signed and Sealed this
Fifth Day of May, 2020

Andrei Iancu
*Director of the United States Patent and Trademark Office*